United States Patent
Arita et al.

(10) Patent No.: US 10,451,933 B2
(45) Date of Patent: Oct. 22, 2019

(54) DISPLAY DEVICE INCLUDING CURVED DISPLAY PANEL

(71) Applicant: Mitsubishi Electric Corporation, Tokyo (JP)

(72) Inventors: Kenji Arita, Tokyo (JP); Takashi Miyayama, Tokyo (JP); Hirofumi Iwanaga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/716,025

(22) Filed: Sep. 26, 2017

(65) Prior Publication Data

US 2018/0113349 A1  Apr. 26, 2018

(30) Foreign Application Priority Data

Oct. 20, 2016 (JP) .................... 2016-205705

(51) Int. Cl.

| G02F 1/1345 | (2006.01) |
| G02F 1/1333 | (2006.01) |
| H05K 1/11 | (2006.01) |
| G02F 1/1335 | (2006.01) |
| H05K 1/14 | (2006.01) |
| H05K 1/02 | (2006.01) |

(Continued)

(52) U.S. Cl.
CPC .... *G02F 1/13452* (2013.01); *G02F 1/133305* (2013.01); *G02F 1/133608* (2013.01); *H05K 1/118* (2013.01); *H05K 1/147* (2013.01); *G02F 2001/133317* (2013.01); *H05K 1/028* (2013.01); *H05K 1/189* (2013.01); *H05K 3/361* (2013.01); *H05K 2201/10128* (2013.01); *H05K 2201/10189* (2013.01)

(58) Field of Classification Search
CPC .......... G02F 1/13452; G02F 1/133305; G02F 1/133608; G02F 2001/133317; H05K 1/118; H05K 1/147; H05K 1/028; H05K 1/189

See application file for complete search history.

(56) References Cited

U.S. PATENT DOCUMENTS

| 7,123,249 B2 | 10/2006 | Takenaka |
| 2004/0170087 A1 | 9/2004 | Shimizu |

(Continued)

FOREIGN PATENT DOCUMENTS

| CN | 101447147 A | 6/2009 |
| CN | 104376787 A | 2/2015 |

(Continued)

OTHER PUBLICATIONS

An Office Action mailed by the State Intellectual Property Office of the People's Republic of China dated Jun. 5, 2019, which corresponds to Chinese Patent Application No. 201710998544.5 and is related to U.S. Appl. No. 15/716,025; with English language translation.

*Primary Examiner* — Lisa S Landis

(74) *Attorney, Agent, or Firm* — Studebaker & Brackett PC

(57) ABSTRACT

Regions including a respective plurality of connectors of a relay FPC are disposed while respectively facing a plurality of planes of a lower frame formed in accordance with a curvature of a curved display panel, and a connection FPC mounted in an end portion of the display panel is connected to the connector of the relay FPC.

7 Claims, 7 Drawing Sheets

(51) Int. Cl.
 *H05K 1/18* (2006.01)
 *H05K 3/36* (2006.01)

(56) References Cited

U.S. PATENT DOCUMENTS

| | | | |
|---|---|---|---|
| 2008/0055834 A1* | 3/2008 | Matsuzaki | G02F 1/133308 |
| | | | 361/679.01 |
| 2009/0135568 A1 | 5/2009 | Jeong | |
| 2009/0161048 A1* | 6/2009 | Satake | G02F 1/133305 |
| | | | 349/110 |
| 2016/0100486 A1 | 4/2016 | Chen et al. | |

FOREIGN PATENT DOCUMENTS

| | | |
|---|---|---|
| JP | 2004-061715 A | 2/2004 |
| JP | 2004-253559 A | 9/2004 |

* cited by examiner

F I G. 8
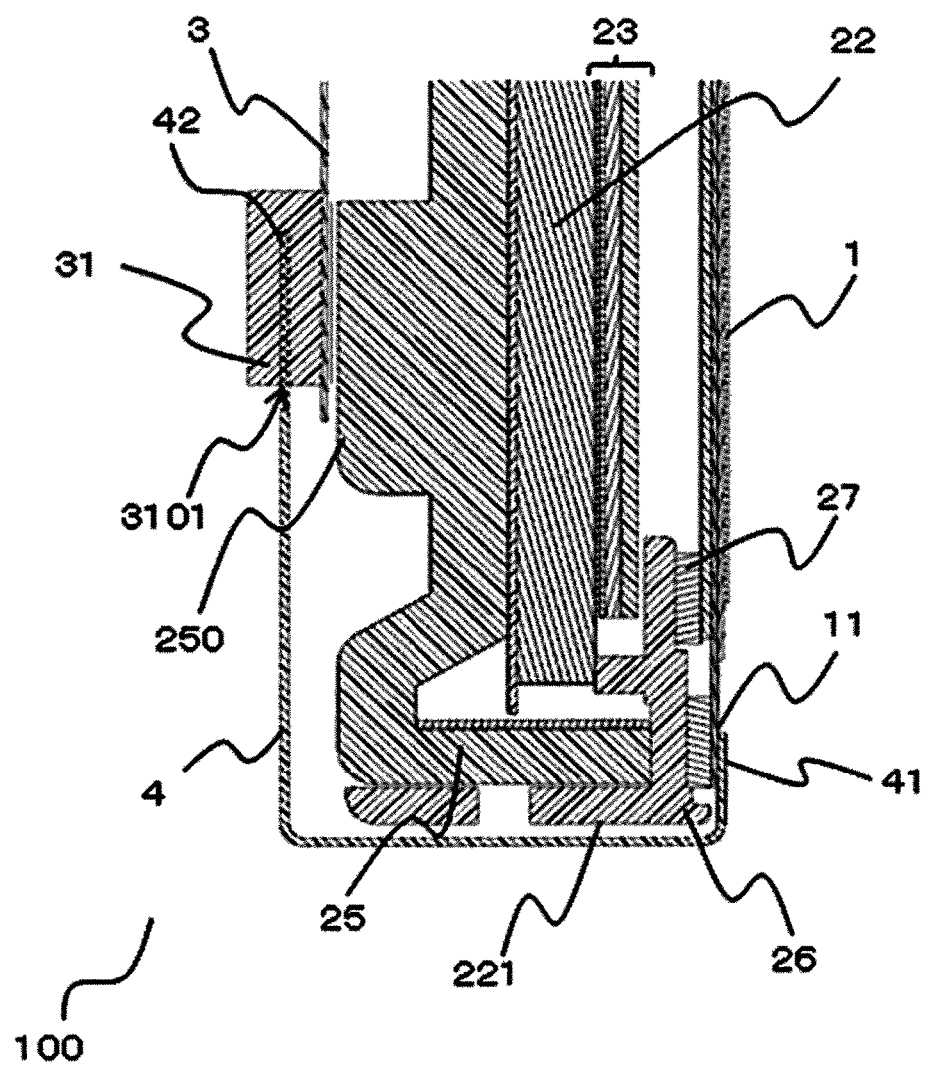

DISPLAY DEVICE INCLUDING CURVED DISPLAY PANEL

BACKGROUND OF THE INVENTION

Field of the Invention

The present invention relates to a display device including a display panel that displays an image, and more particularly to a display device including a curved display panel.

Description of the Background Art

As information electronic apparatuses have been widely used in recent years, display devices each including a display panel provided in its front surface with a protective member with solidity are used in various fields. There are cases where a display apparatus provided with a display device includes a display surface of the display device and a touch panel or a protective member that are integrated with each other by using a transparent resin or the like to prevent deterioration in visibility due to surface reflection of light from outside, as well as to protect the display device from shock from outside, and exposure to water and dust. As a display device for in-vehicle application, a display device with a curved display panel used to improve designability in a vehicle interior space is coming into widespread use.

While the display device includes a circuit board that controls the display panel, there is unfortunately a problem in that when a connection flexible printed circuit board (hereinafter referred to as an FPC) connecting the circuit board is connected to an end portion of the display panel and a connector formed in the circuit board to receive a signal from the outside, the connection FPC may be deformed to cause stress because the display panel has a curved surface, thereby causing the display panel to be broken.

As a countermeasure against the above, Japanese Patent Application Laid-Open No. 2004-253559 discloses a structure of an electronic apparatus in which a wiring member (connection FPC) is provided with a stress relaxation portion. In addition, Japanese Patent Application Laid-Open No. 2004-61715 discloses a structure of a liquid crystal display device in which a COF film for mounting (connection FPC) is provided with a slit to absorb stress.

When a connection FPC with a structure to absorb stress is provided in a curved display panel as described above, the connection FPC is complicated in shape to restrict design flexibility, and thus is unreliable. In addition, the connection FPC is complicated in shape, and thus has low versatility to cause increase in manufacturing cost.

SUMMARY OF THE INVENTION

It is an object of the present invention to prevent deformation of a connection FPC in a display device provided with a curved display panel so that stress is prevented from occurring in the display panel to prevent breakage of the display panel.

A display device according to the present invention includes a display panel, a backlight, a first wiring board, and a second wiring board. The display panel is curved, and displays an image. The backlight is disposed on an opposite side to a display surface of the display panel, and includes a frame provided in its inside with a light source to irradiate the display panel. The first wiring board is provided with wiring to input a signal into the display panel. The second wiring board connects the first wiring board and an end portion of the display panel to each other. The first wiring board has at least one connector into which an end portion of the second wiring board is inserted. The frame has at least one plane formed in accordance with a curvature of the display panel, and the at least one plane is disposed to face region including the at least one connector of the first wiring board.

In the display device provided with the curved display panel, deformation of the connection FPC is prevented so that stress is prevented from occurring in the display panel to prevent breakage of the display panel.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is s sectional view taken along line A-A of FIG. 7 of the present invention;

DESCRIPTION OF THE PREFERRED EMBODIMENTS

An embodiment of a display device of the present invention will be described below with reference to drawings. In the description below, components designated by the same reference sign are identical or substantially identical. Thus, detailed description of the components may be eliminated. In addition, dimensions, a material, a shape, a placement position, and the like, indicated for each component in the present embodiment can be appropriately changed depending on a configuration and various conditions of a device to which the present invention is applied, and thus are not limited.

First Preferred Embodiment

Figure 1:
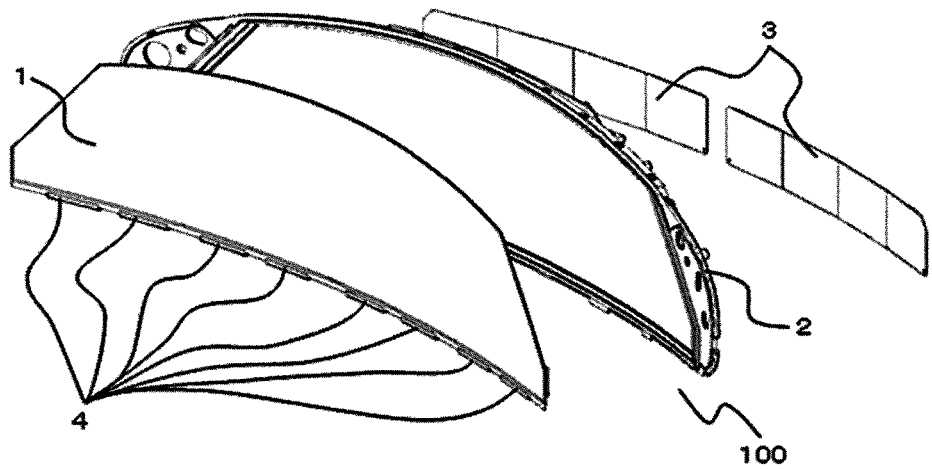
FIG. 1 is an exploded perspective view of a display device according to the present invention.
Figure 2:
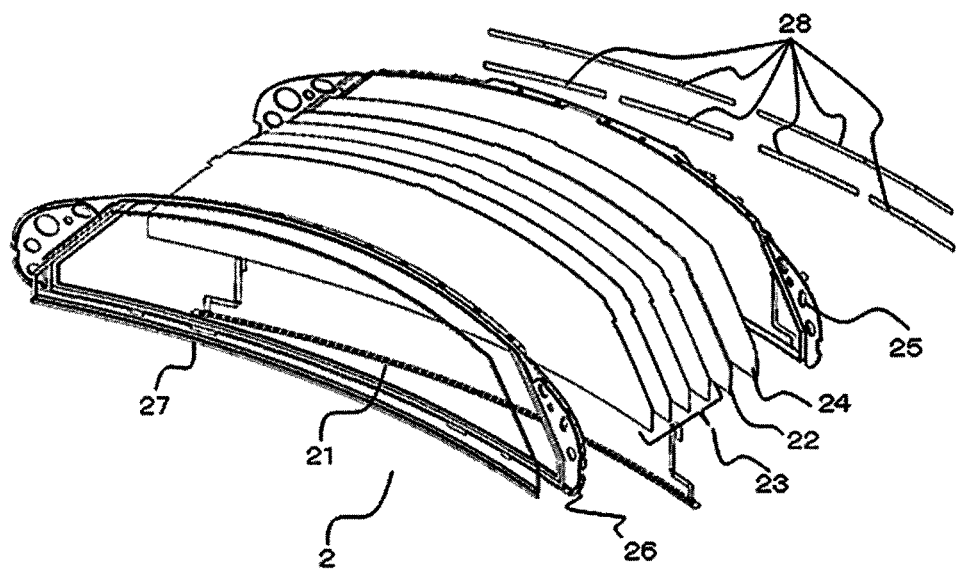
FIG. 2 is an exploded perspective view of a backlight according to the present invention.
Figure 3:
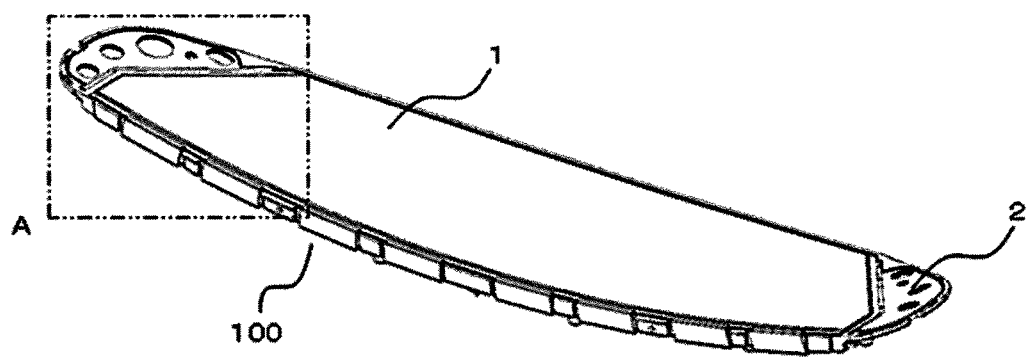
FIG. 3 is a perspective view of the display device according to the present invention.
Figure 4:
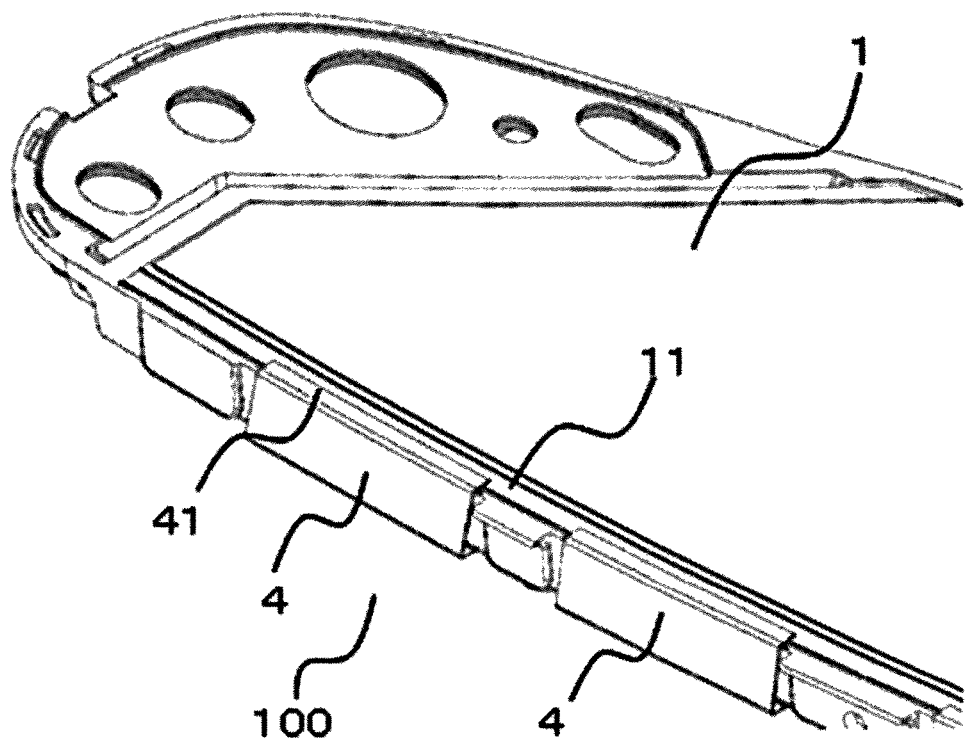
FIG. 4 is an enlarged view of the portion A of FIG. 3.
Figure 5:
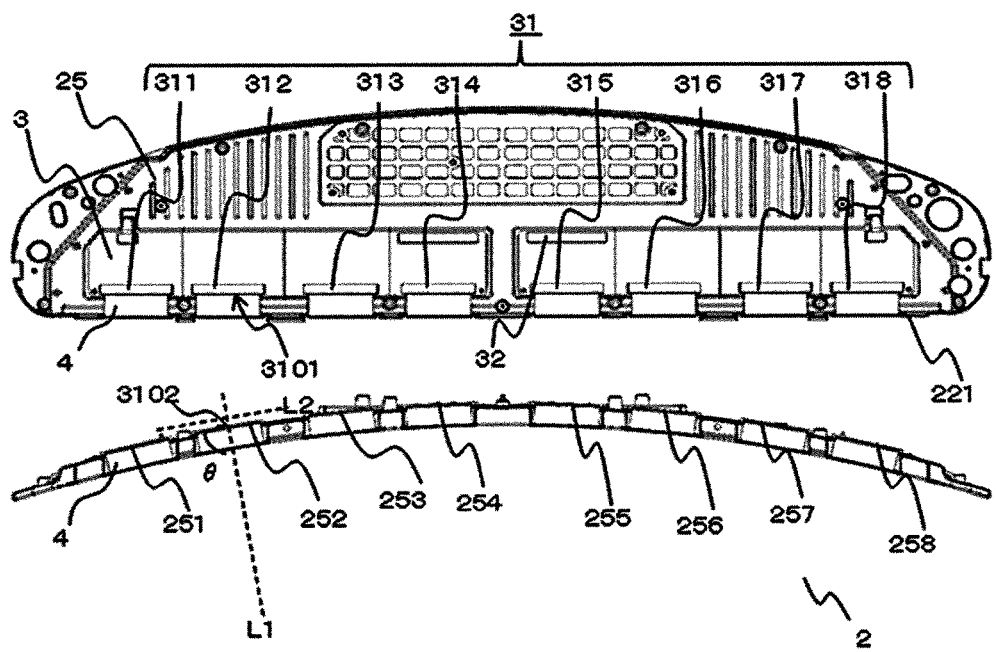
FIG. 5 is a back view and a side view of the display device according to the present invention.
Figure 6:
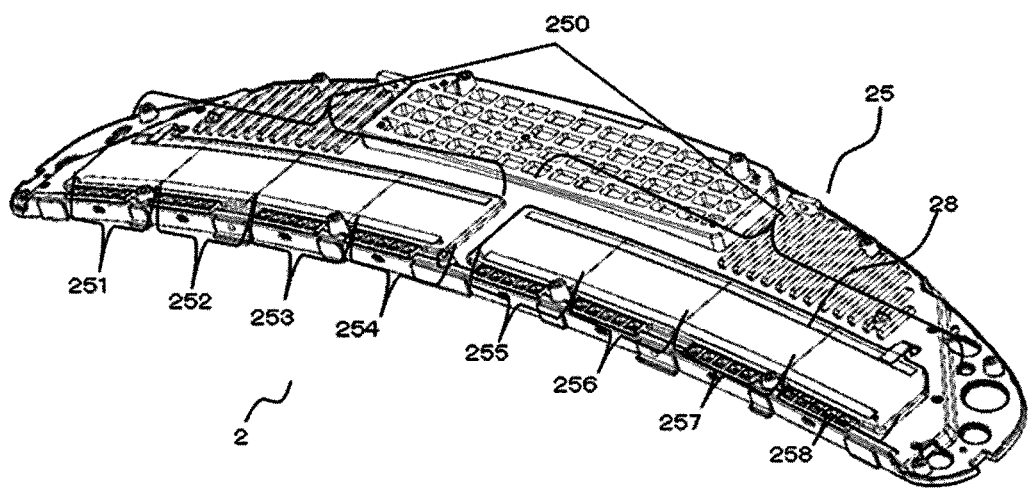
FIG. 6 is a perspective view of a back surface of a lower frame 25 constituting the backlight according to the present invention.
Figure 7:
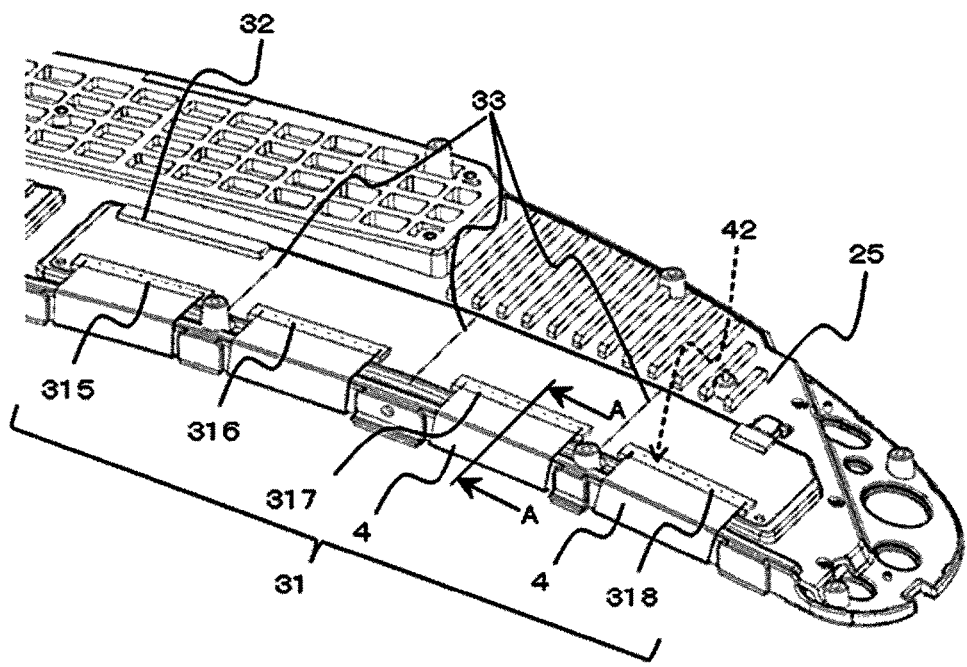
FIG. 7 is a perspective view of a back surface of the display device according to the present invention.

FIG. 1 is an exploded perspective view of a display device according to the present invention, FIG. 2 is an exploded perspective view of a backlight according to the present invention, FIG. 3 is a perspective view of the display device according to the present invention, FIG. 4 is an enlarged view of the portion A of FIG. 3, FIG. 5 is a back view and a side view of the display device according to the present invention, FIG. 6 is a perspective view of a back surface of a lower frame 25 constituting the backlight according to the present invention, FIG. 7 is a perspective view of a back surface of the display device according to the present invention, and FIG. 8 is s sectional view taken along line A-A of FIG. 7 of the present invention.

<Display Device>

In FIG. 1, a display device 100 of the present invention includes: a curved display panel 1 that displays an image; a curved backlight 2 that irradiates the curved display panel 1 on an opposite side to its display surface; a relay FPC 3 serving as a first wiring board that is provided on a back surface of the backlight 2 and on which wiring is formed to input a control signal into the display panel 1; and a connection FPC 4 serving as a second wiring board that connects the relay FPC 3 and the display panel 1 to each other to input a control signal from the relay FPC 3 into the display panel 1.

<Display Panel>

As the display panel 1, a plasma display panel, an organic EL panel, a liquid crystal display panel, or the like is available. The liquid crystal display panel applies birefringence of a liquid crystal, and includes: a first base plate that is an insulation base plate such as glass on which a coloring layer, a light-shielding layer, a counter electrode, and the like are formed; and a second base plate that is an insulation base plate such as glass on which a thin film transistor to be a switching element, a pixel electrode, and the like are formed. The liquid crystal display panel further includes: a spacer to hold a distance between the first base plate and the second base plate; a sealant to bond the first base plate and the second base plate to each other; a liquid crystal put in between both the base plates; a sealant for an injection port for injecting the liquid crystal; an oriented film configured to allow to orient the liquid crystal; and a polarizing plate, for example.

<Backlight>

As illustrated in FIG. 2, the backlight 2 includes a light source 2 that emits light, a light guide plate 22 that transmits light emitted from the light source 2, an optical sheet 23 disposed on an emission surface of the light guide plate 22, a reflection sheet 24 disposed on an opposite side of the light guide plate 22 to the emission surface, and a lower frame 25 that internally holds these components, for example. The lower frame 25 is fitted with an upper frame 26 to constitute the backlight 2. The upper frame 26 is provided on its front surface with a cushion 27 to protect and hold a back surface of the display panel 1, opposite to the display surface thereof. The backlight 2 also includes a joint member 28 to fix the relay FPC 3 disposed on a back surface to the lower frame 25. The joint member 28 is formed of a double-sided tape or an adhesive, and may have a waterproof function and cushioning characteristics. The joint member 28 also may have a structure in which a double-sided tape or an adhesive is applied to a cushioning member with a waterproof function and cushioning characteristics. When a hardening resin or the like is used, adhesion increases as time elapses, and thus adhesion of the joint member 28 can be further improved. The joint member 28 can be disposed between the backlight 2 and a protective member described below, or between the display panel 1 and the backlight 2.

<FPC>

The relay FPC 3 serving as a first wiring board, as well as the connection FPC 4 serving as a second wiring board, is a wiring board formed on a base film. The base film is formed of polyimide, polyester, or the like, and wiring is formed on the base film by using a conductor pattern formed with a conductive material formed of metal. In addition, a plurality of resin protection films (coverlay) is stacked on a surface of the wiring.

<Touch Panel>

The touch panel (not illustrated) is used to covert information on a position coordinate input from the outside (an operator) into an electric signal by using a circuit composed of a transparent electrode formed on a transparent base plate, and then transmits the converted electric signal to a control circuit (not illustrated) disposed in a terminal product through an output wiring member. A touch panel of a projection capacity type is used in many cases. The touch panel of a projection capacity type performs input of signals while accurately determining a contact position with a fingertip of an operator, or the like, by measuring a ratio of the amount of electric currents flowing through a plurality of transparent electrodes at the contact position and around there. As upper and lower base plates constituting the touch panel, transparent glass is available, for example.

<Protective Member>

The protective member (not illustrated) is disposed on the touch panel or a front surface of the display panel 1 to prevent the touch panel and the display panel 1 from receiving damage, deformation, abrasion, contamination, and the like, due to pressurization or contact from the outside, and is formed of almost transparent material such as glass and plastic. It is desirable that the protective member uses glass with high strength, being less likely to deform. In addition, when the protective member has a thickness more than a thickness of the touch panel, or about twice the thickness of the touch panel, deformation or breakage of the touch panel can be avoided. Further, printing or painting to a front surface or a back surface of the protective member enables the protective member to further have a function of a design member.

Subsequently, characteristic structure of the display device 100 according to the first preferred embodiment of the present invention will be described in detail. As illustrated in FIG. 3 or 4, a mounting portion 41 being one of end portions of the connection FPC 4 is mounted in an end portion 11 of the display panel 1 in the display device 100 of the present invention. The other of the end portions of the connection FPC 4 is disposed on a back surface side of the display device 100. The present invention allows a plurality of the connection FPCs 4 to be disposed in the end portion 11 of the curved display panel 1. The connection FPC 4 is in the shape of a strip in a rectangle shape with high versatility that does not restrict design flexibility, and each of the plurality of the connection FPCs 4 has a substantially identical size.

Subsequently, the characteristic structure of the display device 100 will be described with reference to FIGS. 5 to 8. FIG. 6 eliminates the relay FPC 3 for description. As illustrated in FIGS. 5 to 8, each of the plurality of the connection FPCs 4 has the mounting portion 41 connected to the end portion 11 of the display panel 1, and is folded in a U-shape turned sideways in sectional view so as to surround a part of a side portion 221 of the lower frame 25 constituting the backlight 2 so that a connector insertion portion 42 of the other end portion of the connection FPC 4 is disposed on a back surface side of the lower frame 25, as described above.

The relay FPC 3 is in the shape of a rectangle, and includes a plurality of connectors 31 (311 to 318). In the present embodiment, two relay FPCs 3 are disposed in accordance with a length of the end portion 11 of the curved display panel 1. The relay FPC 3 further includes a connector 32 to be connected to a control board (not illustrated) that is disposed to input a signal from the outside to the relay FPC 3. Each of the plurality of connectors 311 to 318 is disposed in the end portion of the relay FPC 3, near the side portion 221 of the backlight 2. When the connector insertion portion 42 of the connection FPC 4, extending from the end portion 11 of the display panel 1, is inserted into a connector insertion opening 3101 of the connector 31, the relay FPC 3 is connected to the connection FPC 4.

In the present embodiment, four connectors 31 are formed in each of the relay FPCs 3. The number of connection FPCs 4 is set depending on resolution, and thus is not limited.

When the connection FPC 4 is connected to the display device 100 provided with the curved display panel 1, the connection FPC 4 connected to the end portion 11 of the display panel 1 is folded toward a back surface side of the backlight 2 in a U-shape turned sideways in sectional view. The connector insertion portion 42 of the connection FPC 4 is inserted into the connector insertion opening 3101 of the relay FPC 3 to connect both of the FPCs 3 and 4. At this time, when the connection FPC 4 folded in a U-shape turned sideways has a defect due to its deformation, stress is applied to the connection FPC 4 and is transmitted to the end portion 11 of the display panel 1, and then the display panel 1 may be broken.

Thus, in the present invention, a plurality of planes 251 to 258 is formed on a back surface of the lower frame 25 in accordance with a curvature of the curved display panel 1 as illustrated in FIGS. 5 and 6. Then, regions including respective connectors 311 to 318 of the relay FPC 3 are respectively disposed in the planes 251 to 258 constituting a polygonal surface 250. Specifically, the region including the connector 311 of the relay FPC 3 is disposed while facing the plane 251. Likewise, the region including the connector 312 of the relay FPC 3 is disposed while facing the plane 252. In this way, regions including the respective connectors 311 to 318 of the relay FPC 3 are disposed while facing the corresponding planes 251 to 258.

Each of the planes 251 to 258 will be described. In the side view of FIG. 5, each of the planes 251 to 258 is set such that an angle θ formed by an extension line L1 drawn from a center portion 3102 as viewed from a direction of the connector insertion opening 3101 in side view toward the center of a curvature of the display panel 1, and a line L2 parallel to the connector 31 disposed on each of the planes 251 to 258, and particularly to the insertion opening 3101 of the connector, is to be substantially square. That is, each of the planes 251 to 258 is set such that each connector 31 of the relay FPC 3, and particularly the insertion opening 3101 of the connector, is disposed parallel to the corresponding one of the planes 251 to 258 of the lower frame 25. While it is desirable that the angle θ is 90°, the angle θ can be appropriately set within a range of 90°±5° when the connection FPC 4 can be disposed while being folded in a substantially U-shape turned sideways in sectional view.

An angle formed by corresponding planes adjacent to each other (the plane 251 and the plane 252, for example) is appropriately set by a position at which the connector 31, specifically the connector insertion opening 3101, is disposed.

In the present invention, regions including the respective connectors 311 to 318 of the relay FPC 3 are disposed while facing the corresponding planes 251 to 258 in accordance with a curvature of the curved display panel 1. The planes 251 to 258 in accordance with a curvature of the curved display panel 1 are formed in a structure in which the mounting portion 41 is connected to the end portion 11 of the display panel 1, and the connector insertion portion 42 is connected to the connector 31, in the connection FPC 4, so that the connection FPC 4 can be prevented from being deformed. This enables the display panel 1 to be prevented from being broken due to stress applied to the end portion 11 of the display panel 1. In the present invention, the connector insertion opening 3101 and each of the planes 251 to 258 are disposed so as to be substantially parallel to each other. As a result, stress to be applied to the connector connection portion 42 of the connection FPC 4 can be reliably reduced.

As described above, according to the display device 100 of the present invention, when the regions including the respective plurality of connectors 311 to 318 of the relay FPC 3 are disposed while respectively facing the plurality of planes 251 to 258 of the lower frame 25 formed in accordance with a curvature of the curved display panel 1, and the connection FPC 4 mounted in the end portion 11 of the display panel 1 is connected to the connector 31 of the relay FPC 3, the connection FPC 4 can be disposed without being deformed. Thus, the display panel 1 can be prevented from receiving stress to enable the display panel 1 to be prevented from being broken, so that the display device 100 can be improved in reliability.

When each connector 31 is disposed while facing the corresponding one of the planes 251 to 258, each connector 31 can be prevented from receiving stress by connecting the connector connection portion 42 of the connection FPC 4 to each connector 31. As a result, it is possible to prevent the connector 31 from being broken to prevent a defective display of the display device 100.

The connector connection portion 42 of the connection FPC 4 can be prevented from generating stress, so that a defective display of the display device 100 can be prevented by preventing the connector connection portion 42 of the connection FPC 4 from coming out of the connector 31.

Each connector 31 is disposed while facing the corresponding one of the planes 251 to 258, so that workability when the connector connection portion 42 of the connection FPC 4 is inserted can be improved.

When a plurality of the connection FPCs 4 is used, it is possible to use the connection FPC 4 with a substantially identical length from the mounting portion 41 in the end portion 11 of the display panel 1 to the connector insertion portion 42 in the other end portion thereof. As a result, commonality of the connection FPCs 4 can be achieved, so that increase in cost can be reduced.

The relay FPC 3 is bonded to each of the planes 251 to 258 with the joint member 28 as described above, and a folded portion 33 is formed between the corresponding adjacent planes 251 to 258. In the present embodiment, the folded portion 33 of the relay FPC 3 includes a region with a portion without a coverlay. When the relay FPC 3 is folded so as to correspond to each plane while the folded portion 33 serves as a starting point, the relay FPC 3 can be prevented from generating stress caused by folding. As a result, the connector 31 formed in the relay FPC 3 can be further prevented from receiving stress.

While the region with a portion without a coverlay is set in accordance with a distance between planes of the relay FPC 3 disposed in the corresponding planes 251 to 258 formed in the lower frame 25, the region with a portion without a coverlay needs to have a width of 1 mm or more. When the width is increased with decrease in a curvature of the display panel 1, the relay FPC 3 can be prevented from peeling off or separating from each of the planes 251 to 258 of the lower frame 25.

Second Preferred Embodiment

Figure 9:
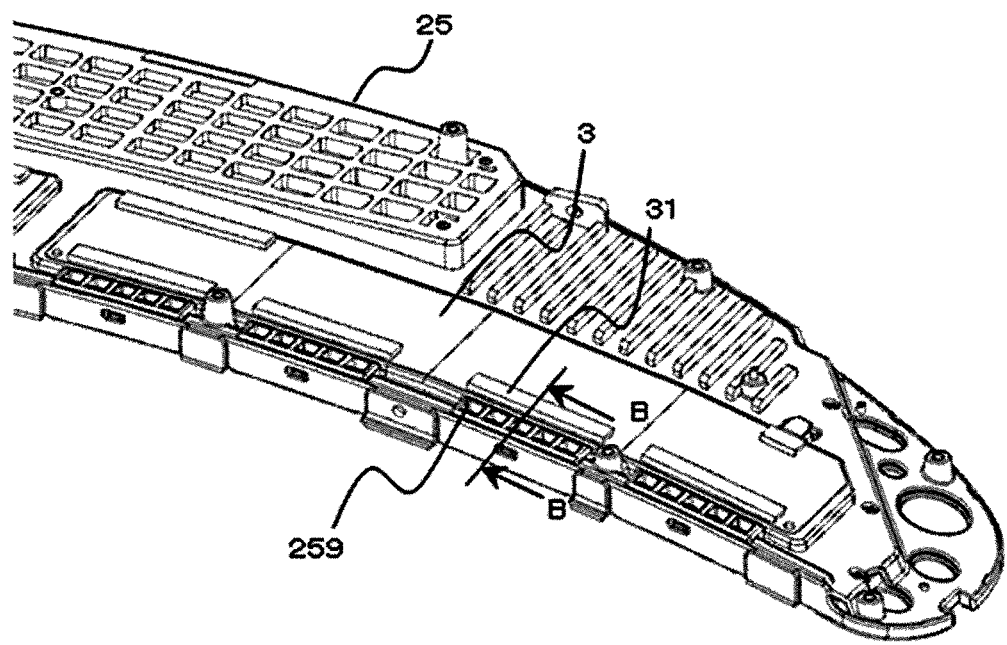
FIG. 9 is a perspective view of a back surface of the backlight according to the present invention.
Figure 10:
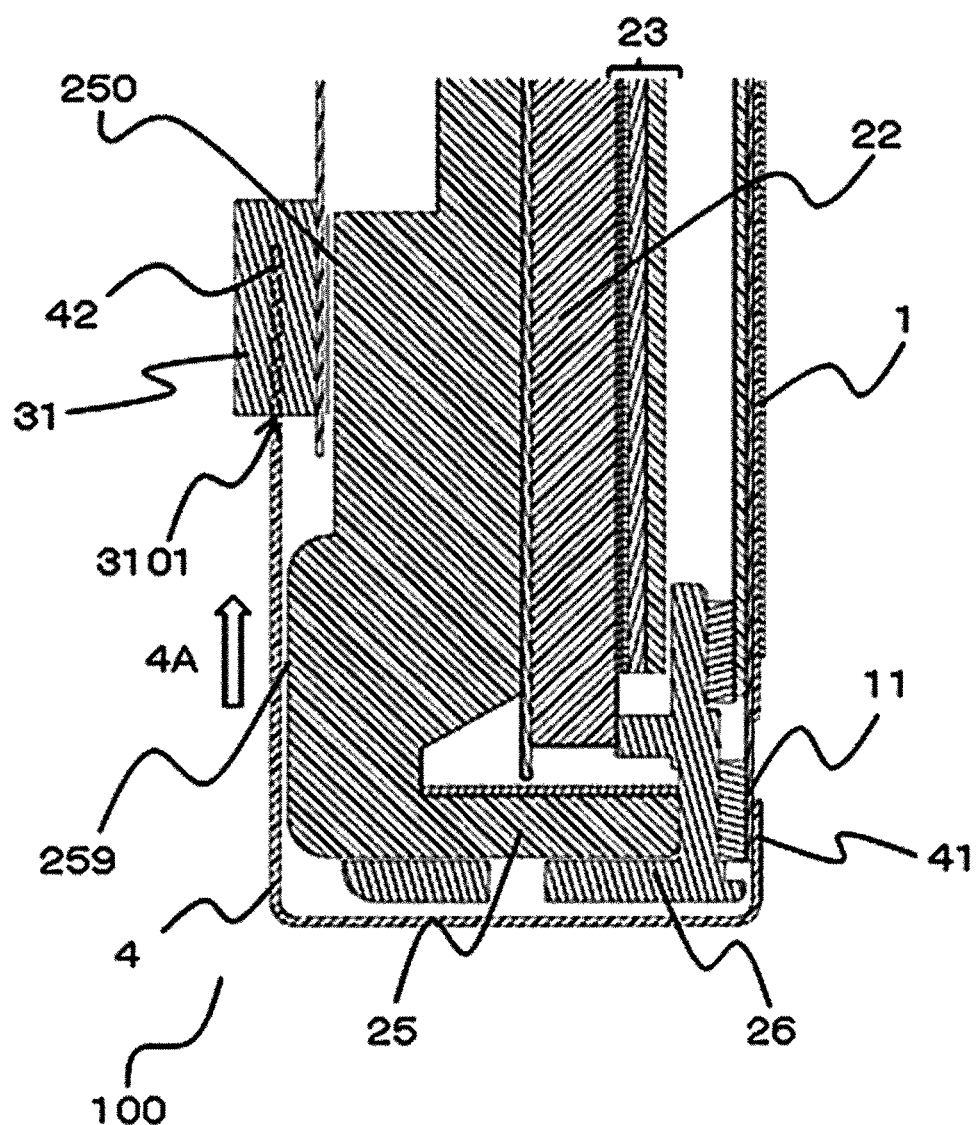
FIG. 10 is s sectional view taken along line B-B of FIG. 9 of the present invention.

A perspective view of a back surface of the backlight according to the present invention is illustrated in FIG. 9;

and a sectional view taken along line B-B of FIG. 9 is illustrated in FIG. 10. The first preferred embodiment has the structure in which the lower frame 25 includes the polygonal surface 250 formed with planes in accordance with a curvature of the curved display panel 1, and each connector 31 of the relay FPC 3 is disposed in the corresponding one of the planes. As illustrated in FIG. 9 or 10, the present second preferred embodiment includes a lower frame 25 in which a protrusion 259 is formed near an insertion portion of a connector 31 of a relay FPC 3. The protrusion 259 protrudes outward from the lower frame 25, and has a height equivalent to that of a connector insertion portion in sectional view. Forming this structure enables a connection FPC 4 to be inserted into the connector 31 while sliding along the protrusion 259 in a direction 4A, when a connector connection portion 42 of the connection FPC 4 is inserted into the connector 31 to connect the connection FPC 4 and the connector 31 to each other. As a result, workability is improved, and the connection FPC 4 can be prevented from being deformed or generating stress when the connection FPC 4 is inserted into the connector 31.

In the present invention, each of the embodiments may be freely combined, or appropriately modified, within the scope of the invention, and any of the embodiments may be eliminated.

While the invention has been shown and described in detail, the foregoing description is in all aspects illustrative and not restrictive. It is therefore understood that numerous modifications and variations can be devised without departing from the scope of the invention.

What is claimed is:

1. A display device comprising:
a curved display panel that displays an image;
a backlight that is disposed on an opposite side to a display surface of said curved display panel, and includes a frame provided in its inside with a light source to irradiate said curved display panel;
a first wiring board that is provided with wiring to input a signal into said curved display panel; and
a second wiring board that connects said first wiring board and an end portion of said curved display panel to each other, wherein
said first wiring board has at least one connector into which an end portion of said second wiring board is inserted, and
said frame has a plurality of flat planes formed to be aligned in a direction of a curvature of said curved display panel, such that each two adjacent flat planes are formed at an angle to one another, and said plurality of flat planes is disposed to face a region including said at least one connector of said first wiring board.

2. The display device according to claim 1, wherein
said at least one connector includes a connector insertion opening into which the end portion of said second wiring board is inserted, and said connector insertion opening and said plurality of flat planes formed in said frame are disposed to be substantially parallel.

3. A display device comprising:
a curved display panel that displays an image;
a backlight that is disposed on an opposite side to a display surface of said curved display panel, and includes a frame provided in its inside with a light source to irradiate said curved display panel;
a first wiring board that is provided with wiring to input a signal into said curved display panel; and
a second wiring board that connects said first wiring board and an end portion of said curved display panel to each other, wherein
said first wiring board has at least one connector into which an end portion of said second wiring board is inserted,
said frame has at least one plane formed in accordance with a curvature of said curved display panel, and said at least one plane is disposed to face a region including said at least one connector of said first wiring board, and
said at least one plane is formed in said frame such that an angle θ formed by an extension line extending from the center of said at least one connector toward the center of a curvature setting curvature of said curved display panel, and said at least one connector, is set within a range of 90°±5°.

4. The display device according to claim 1, wherein
said at least one connector includes a plurality of connectors,
said plurality of said second wiring boards and a plurality of said connectors into each of which the end portion of said second wiring board is inserted are disposed, and said plurality of flat planes corresponding to respective regions including said plurality of said connectors of said first wiring board is formed in said frame.

5. The display device according to claim 4, wherein
said first wiring board is formed in a rectangular shape in plan view corresponding to the region including said plurality of said connectors, and
said first wiring board includes a folded portion that is formed in a region facing a portion between the corresponding flat planes formed in said frame.

6. The display device according to claim 1, wherein
said frame further includes a protrusion disposed near said connector insertion opening, said protrusion corresponding to a position at which said connector insertion opening of said plurality of planes is disposed in sectional view.

7. The display device according to claim 4, wherein
said first wiring board is formed in a shape corresponding to the region including said plurality of said connectors,
a plurality of protection films is stacked on a surface of wiring formed on a base film, and
said first wiring board includes a region with a portion without said plurality of protection films in a region facing a portion between the corresponding flat planes formed in said frame.

* * * * *